United States Patent
Parker et al.

(10) Patent No.: US 6,331,990 B1
(45) Date of Patent: *Dec. 18, 2001

(54) DEMODULATING AND AMPLIFYING SYSTEMS OF LASERS WITH OPTICAL GAIN CONTROL (DAS-LOGiC)

(75) Inventors: Michael A. Parker, Liverpool; Douglas B. Shire; Chung L. Tang, both of Ithaca, all of NY (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/240,830

(22) Filed: Feb. 1, 1999

(51) Int. Cl.⁷ .................................................. H01S 3/30
(52) U.S. Cl. .................................. 372/8; 372/26; 372/50
(58) Field of Search .................................... 372/8, 50, 75

(56) References Cited

U.S. PATENT DOCUMENTS 4,607,916 * 8/1986 Sanford ................................. 350/376
5,748,653 * 5/1998 Parker ......................................... 372/8

* cited by examiner

Primary Examiner—James W. Davie
Assistant Examiner—Gioacchino Inzirillo
(74) Attorney, Agent, or Firm—Harold L. Burstyn; Joseph A. Mancini

(57) ABSTRACT

The present invention demodulates a FM, WM or AM optical input beam, amplifies the signal impressed on the beam, and then modulates without intervening electronics the signal amplitude of an output beam. The apparatus can be made from any semiconductor laser, including edge-emitting lasers and VCSELs. Light transmitted through the waveguide (the "control beam") interacts with the carrier population of the laser, reducing the available gain and thereby the output intensity. The present invention has three key advantages: (i) a FM control beam produces an amplitude-modulated output beam from the main-laser, (ii) the amplitude of the AM beam depends directly on the differential gain $\partial G/\partial \omega$, and (iii) the apparatus and method provides gain for all LOGiC devices. The present invention works with available and future semiconductor lasers, including those emitting in the blue as well as those operating at 670, 850, 980, 1300, and 1500 nm. The 1300 and 1500 nm lasers are of particular importance for fiber communications.

14 Claims, 3 Drawing Sheets

DEMODULATING AND AMPLIFYING SYSTEMS OF LASERS WITH OPTICAL GAIN CONTROL (DAS-LOGIC)

STATEMENT OF GOVERNMENT INTEREST

The invention described herein may be manufactured and used by or for the Government for governmental purposes without the payment of any royalty thereon.

BACKGROUND OF THE INVENTION

The present invention relates to optical signal conversion and amplification. In particular, it improves on the devices and methods of U.S. Pat. No. 5,604,628 issued Feb. 18, 1997, U.S. Pat. No. 5,742,045 issued Apr. 21, 1998, and U.S. Pat. No. 5,748,653 issued May 5, 1998, the disclosures of which are hereby incorporated by reference. The present invention improves the Lasers with Optical Gain Control ("LOGiC") devices and methods of these patents by providing a mechanism for signal amplification and conversion of a frequency-modulated ("FM"), a wavelength-multiplexed ("WM"), or an amplitude-modulated ("AM") optical signal into an amplified amplitude-modulated optical signal.

The LOGiC devices offer the possibility of integrating all-optical high-speed communications and signal processing. These devices can route signals, exercise logic functions, and filter spontaneous emission. A LOGiC device typically comprises a semiconductor main laser with a control beam that enters the side of the laser cavity at right angles (see FIG. 1 for a block diagram). The main laser can be an in-plane laser (IPL), a vertical cavity laser (VCSEL), or an electrically/optically-pumped semiconductor amplifier. The control beam can originate from a monolithically integrated optical amplifier or semiconductor laser or from a fiber/waveguide that is butt-coupled to the side of the main laser. In operation, increasing control-beam power $P_c$ (with angular frequency $\omega_c$) causes output-beam power $P$ (with angular frequency $\omega$) to decrease. Other optical modulation is possible for fiber lasers that use DBR mirrors and two longitudinal modes.

Although a number of LOGiC devices have been developed for signal routing, optical filtering, and Boolean logic, these devices do not have optical gain—defined by $$G_{opt} \equiv \left| \frac{dP}{dP_c} \right| \text{ -- since } G_{opt}$$

is less than one for devices of the prior art. Optical gain $G_{opt} > 1$ is required to regenerate, amplify, and condition optical signals and to cascade LOGiC devices in multi-element circuits. When the optical gain is greater than one ($G_{opt} \gg 1$), small variations in an input signal $P_c$ result in large changes of an output signal P, hence amplification.

In addition, the LOGiC devices of the prior art do not explicitly address the possibility of optical FM demodulation. Demodulation and wavelength conversion are important for optical signal routers and communications systems. FM communications links are generally chosen over AM links when low-noise characteristics are important. However, there is no single, integrable device that can convert a FM signal into an AM signal, as is typical of a FM discriminator in communications equipment.

Therefore the LOGiC devices of the prior art can be improved by adding mechanisms for optical gain, demodulation, and wavelength conversion.

OBJECTS AND SUMMARY OF THE INVENTION

One object of the present invention is to provide apparatus and method to amplify optical signals.

Another object of the present invention is to provide apparatus and method to convert FM optical signals to AM optical signals.

Another object of the present invention is to provide apparatus and method to convert FM optical signals to AM optical signals at effective efficiencies.

Still another object of the present invention is to provide monolithically integrable apparatus to convert FM optical signals to AM optical signals.

Yet another object of the present invention is to provide apparatus and method to convert FM optical signals to AM optical signals that are substantially noise-free even when amplified.

A further object of the present invention is to provide apparatus and method for high-speed conversion of FM optical signals to AM optical signals.

Yet a further object of the present invention is to provide apparatus and method to convert FM optical signals to AM optical signals that produce an identical AM electrical output signal.

Briefly stated, the apparatus and method of the present invention demodulates a FM, WM, or AM optical input beam, amplifies the signal impressed on it, and then modulates the signal amplitude of an output beam without intervening electronics. The device can be made from any semiconductor laser, including edge-emitting lasers and VCSELs. Light transmitted through the waveguide (the "control beam") interacts with the carrier population of the laser, reducing the available gain and thereby the output intensity. There are three key advantages of the present invention (i) a FM control beam produces an AM output beam from the main-laser, (ii) the amplitude of the AM beam depends directly on the differential gain $\partial G/\partial \omega$, and (iii) the apparatus and method of the present invention provides gain for all LOGiC devices presently known. The present invention works with available and future semiconductor lasers, including those emitting in the blue as well as those operating at 670, 850, 980, 1300, and 1500 nm. The 1300 and 1500 nm lasers are of particular importance for fiber communications.

According to an embodiment of the invention, apparatus to manipulate the optical properties of light comprises: at least one first source of stimulated optical emission emitting an output beam; at least one second source of optical emission emitting a control beam; and structure permitting the control beam to interact with the output beam, whereby the output beam is modulated.

According to a feature of the invention, a method of processing an optical signal comprises the steps of: fabricating a first source of stimulated optical emission; coupling to the first source a second source of optical emission; applying a bias to at least one of the first and second sources, the bias being a one of optical and electrical; and extracting from said first source an optical signal modulated by said second source.

According to another feature of the invention, apparatus to manipulate information encoded into an emission of light comprises: first means for generating a stimulated optical emission from at least one first source of stimulated optical emission; second means for generating an optical emission from at least one second source of optical emission; and the optical emission modulating the stimulated optical emission.

These and many other objects and advantages of the present invention will be readily apparent to one skilled in the pertinent art from the following detailed description of a preferred embodiment of the invention and the related drawings, in which like reference numerals designate the same elements.

DESCRIPTION OF THE PREFERRED EMBODIMENT

Figure 1:
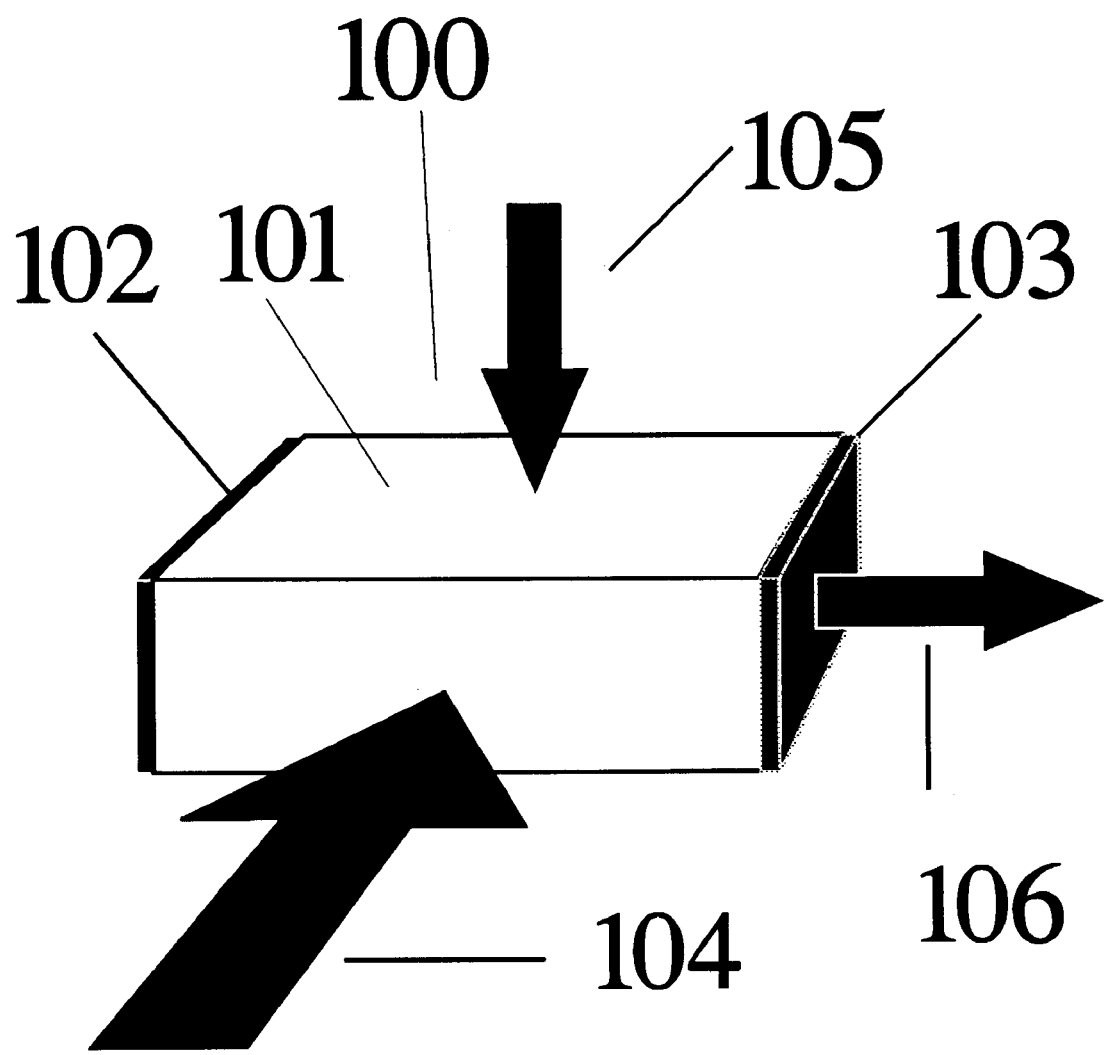
FIG. 1 shows a prior-art block diagram for a Laser with Optical Gain Control

FIG. 1 shows the basic elements of a gain-quenched device. A laser 100 comprises a gain medium 101 and mirrors 102 and 103. A biasing signal 105 inverts the carrier population of laser 100 and brings it above lasing threshold. A control beam 104 transmitted through gain medium 101 interacts with the carrier population, reducing the available gain and therefore reducing the output intensity of light beam 106. LOGiC devices with optical gain can be made from any semiconductor laser, including edge-emitting lasers and VCSELs.

The operation of the DAS-LOGiC is similar to the LOGiC of prior art. The primary difference is the use of frequency-selective mirrors (such as DBR gratings) to offset the lasing freqency from the optical frequency of the control beam. It is this offset in frequency that is responsible for the optical gain.

Figure 2:
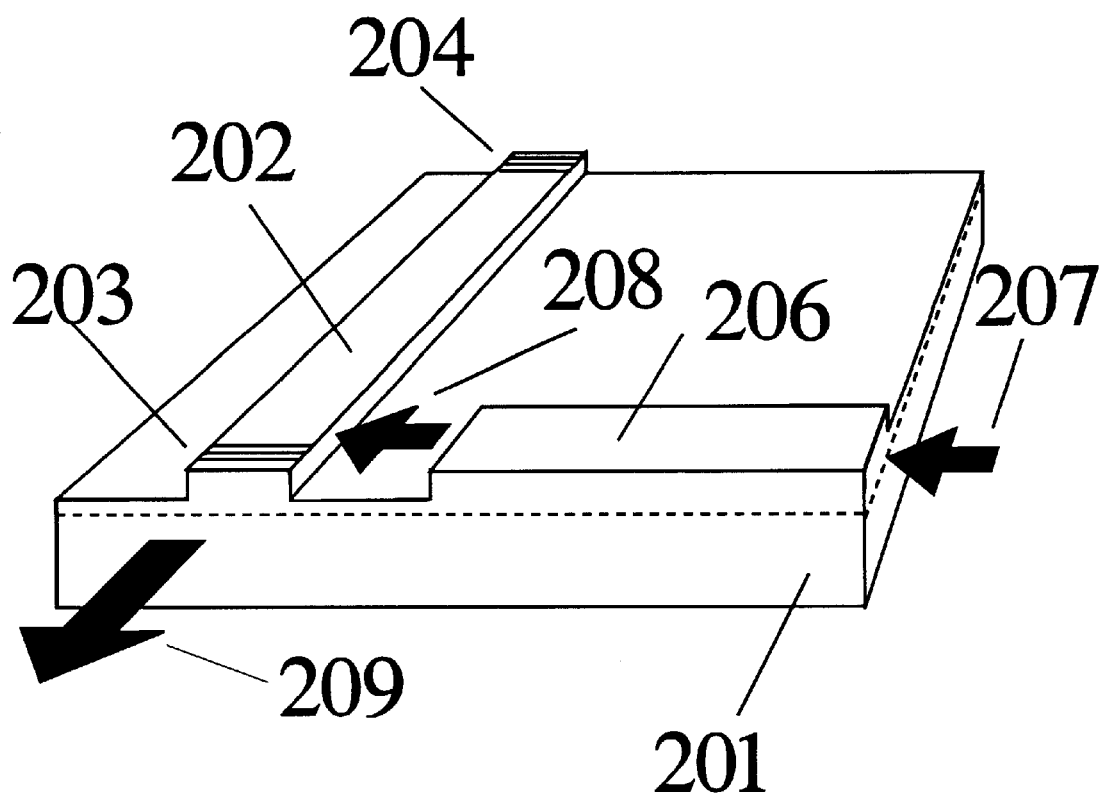
FIG. 2 shows one embodiment of the Demodulating and Amplifying System using Lasers with Optical Gain Control (DAS-LOGiC).

FIG. 2 shows one embodiment of a DAS LOGiC device. A waveguide 206, coupled to a semiconductor main laser 202 in a substrate 201, aligns a control beam 207 as an aligned beam 208. Aligned beam 208 interacts with the carrier population of main laser 202, reduces the available gain, and thereby reduces the output power P of an output beam 209. Frequency selective mirrors 203 and 204 shift the operating wavelength of main laser 202 with respect to the peak of its material gain.

To understand the operation of a DAS-LOGiC device, consider the output power P from main laser 202.

$$P = \frac{\hbar \omega}{2e} \frac{\alpha_{mir}}{\alpha_{mir} + \alpha_{int}} [I - I_{thr}] - \eta_{cm} A \frac{G(\omega_c)}{G(\omega)} P_c. \quad (1)$$

The output power P is linear in the bias current I and the control beam power $P_c$. The first term in Equation 1 is typical for a semiconductor laser biased above the lasing threshold current $I_{thr}$ (i.e., $I > I_{thr}$). $\alpha_{mir}$ and $\alpha_{int}$ are the optical power losses from transmission through mirrors 203 and 204, and in the waveguide of main laser 202, respectively. The second term of equation (1) describes output power P as a function of the optical angular frequency ω of beam 209 from main laser 202 and the angular frequency $\omega_c$ of control beam 207 and aligned beam 208. The wavelength (in vacuum) of a light beam is related to the angular frequency by λ=2πc/ω, where c is the speed of light in vacuum. Other symbols are defined as follows. $\hbar$ is Planck's constant; and e is the elementary electronic charge.

$$A = \frac{\omega}{\omega_c} \frac{A_m}{A_c} R,$$

where $R \equiv \alpha_m L_m/2 \equiv (1-R_m)/2$ for a non-integrated control source and $$R \cong \frac{\alpha_m}{\alpha_c} \cong \frac{1-R_m}{1-R_c} \frac{L_c}{L_m}$$

for two monolithically integrated lasers with cross-coupled cavities. (Subscripts c and m designate control and main lasers respectively.) $\{R_c, L_c, A_c\}$ and $\{R_m, L_m, A_m\}$ are the mirror reflectivities, cavity length, and beam cross sectional area for the control C and main M lasers respectively. $\eta_{cm}$ is coupling efficiency between the control beam and the main laser cavity.

Figure 3:
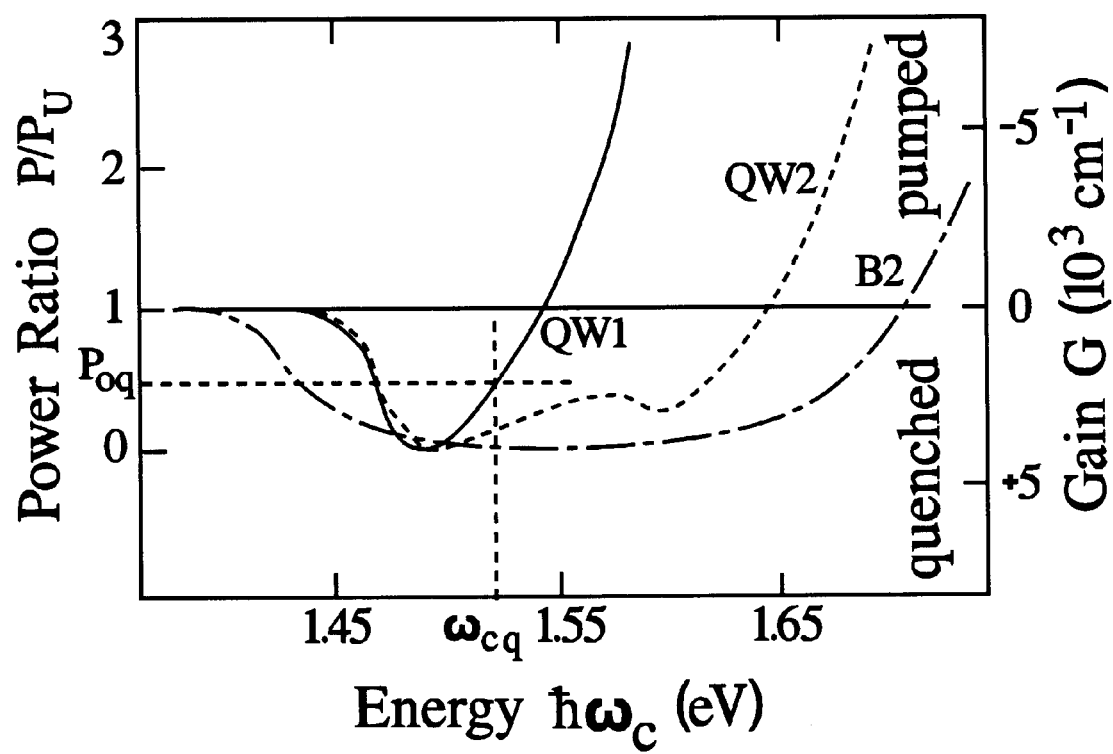
FIG. 3 shows the gain for a laser with a single quantum well (curves labelled QW1 and QW2) and one made from bulk semiconductor (B2) and the normalized power output ($P_{oq}$) from the main laser.

For the present invention, the material (or medium) gain G is the most important quantity. Although gain G is isotropic in the cavity of main laser 202, output beam 209 and control beam 208 have different boundary conditions within the cavity of main laser 202 and therefore produce different results. Within the cavity of main laser 202, the optical field approximates a standing wave (some of the power is transmitted through mirrors 203 and 204), so the Fabry-Perot resonance condition along with the approximate gain condition for lasing (gain≡loss) $G(\omega_o) \equiv \alpha_{tot}/\Gamma$ produces a laser linewidth considerably narrower than the natural linewidth (i.e., the width of the gain curve where G>0 as shown in FIG. 3). The control beam, on the other hand, interacts with the semiconductor according to the dynamics embodied in the gain G(ω) but without Fabry-Perot effects.

The material gain G is due entirely to the material that comprises the cavity of main laser 202, and its magnitude depends on the pumping level (i.e., bias current I). If mirrors are not present on a laser cavity, then an optical beam in the cavity will grow exponentially, approximately as exp(Gx), along the length of that cavity. Sample curves for G are shown in FIG. 3 with the magnitude represented by the right-hand axis. For a laser with flat mirrors (i.e., reflectivity does not depend on wavelength), such as mirrors 102 and 103 shown in FIG. 1, the wavelength of light beam 106 from laser 100 coincides with the wavelength for which G is maximum (near 1.48 eV for QW1 in FIG. 3). However, laser 100 can operate at other wavelengths using frequency-selective mirrors that might be composed of an optical system including lenses, diffraction gratings and mirrors. For either frequency selective mirrors or flat mirrors, if ω is the angular frequency of the emitted light, the magnitude of the material gain is fixed at $G(\omega) = \alpha_{tot}/\Gamma$, (i.e., gain=loss at ω), where $\alpha_{tot} = \alpha_m + \alpha_{int}$ is the total optical loss of the waveguide, and Γ is the optical confinement factor. For frequency selective mirrors 203 and/or 204 in FIG. 2, the mirror loss term $\alpha_{int}$ depends on the optical frequency. If ω is not at the peak material gain (as can be the case for frequency selective mirrors), then $G(\omega_o) > G(\omega) > 0$, where ($\omega_o$ is the angular frequency that corresponds to the peak material gain.

As an example, the material gain G(ω) is shown in FIG. 3 for a variety of conditions. QW1 and QW2 are curves for single quantum well (GaAs—$Al_{0.2}Ga_{0.8}As$) heterostructure with 80 Å wells. B2 is the curve for bulk GaAs with an 80 Å active region. QW1 is pumped to a carrier density of $5 \times 10^{18}$ cm$^{-3}$ while QW2 and B2 are pumped to $12.5 \times 10^{18}$ cm$^{-3}$. The gain scale shown on the right is magnified by a factor of 2.6 for QW1, but the point where the curve crosses the line corresponding to G=0 is unaffected.

The importance of the gain for LOGiC devices is seen in FIG. 3, which shows the normalized output power from the main laser as a function of the photon-energy ($\hbar\omega_c$) of the control beam. The curves are obtained by rewriting Equation 1 as $$\frac{P}{P_u} = 1 - \eta_{cm} A \left[ \frac{G(\omega_c)}{G(\omega)} \right] \frac{P_c}{P_u}, \qquad (2)$$

where the unquenched power $$P_u = \frac{\hbar\omega}{2e} \frac{\alpha_{mir}}{\alpha_{mir} + \alpha_{int}} [I - I_{thr}]$$

is obtained from Equation 1 with $P_c=0$ (control beam "off"). For FIG. 3, the constants are arranged so that, when $\omega_c$ is at peak gain ($\omega_c=\omega_o$), the ratio $G(\omega_c)/G(\omega_o)$ is equal to unity and main laser 202 is fully quenched. The curves in FIG. 3 show that the optical bandwidth for optical gain quenching is identical to the bandwidth of the semiconductor material gain (the portion where G>0). Although the peak gain $G(\omega_o)$ is fixed, there remains a spread in the angular frequency for which $G(\omega)<0$ (pump region) and $G(\omega)>0$ (quench region). If the frequency of the control beam is within the quench/pump region, then the output of main laser 202 will decrease/increase with increasing power in control beam 207.

The mechanism to achieve optical gain shown in FIG. 2 depends on the principles mentioned above. For the optical gain $$G_{opt} \equiv \left| \frac{dP}{dP_c} \right| = \eta_{cm} A \frac{G(\omega_c)}{G(\omega)}$$

to be greater than 1, the angular frequencies of aligned beam 208 and output beam 209 must be chosen so that $G(\omega_c)>G(\omega)>0$ (assuming $\eta_{cm}$ and A are approximately equal to 1). For example, this condition obtains if $\omega_c=\omega_o$ (the peak gain) and $\omega$ is set to $\omega_{cq}$ as shown in FIG. 3. The "off resonance" $\omega$ is obtained by using frequency-selective mirrors 203 and 204 on main laser 202. One typical method is to use gratings in place of flat mirrors, as for a DFB laser. Optical gain can also be achieved by adjusting either the overlap areas in A or the mirror reflectivities in R.

Referring to FIGS. 2 and 3, FM to AM conversions work as follows. Assume that main laser 202 has flat mirrors 203 and 204. It therefore lases near the peak gain (i.e., $\omega=\omega_o$). If the center (or quiescent) frequency of an input carrier signal (impressed on control beam 207) is $\omega_{cq}$ (as shown in FIG. 3), then any departure of the angular frequency of control beam 207 from $\omega_{cq}$ changes the power in main-laser output beam 209 from its value of $P_{oq}$ at $\omega_{cq}$. Therefore an input FM signal produces an AM output signal.

The characteristics of the conversion are determined as follows. Assume the time dependence of the angular frequency of control beam 207 is given by $\omega_c(t)=\omega_{cq}+\phi(t)$, where $\omega_{cq}$ is the center frequency of the FM carrier and $\phi(t)$ represents the encoded information. The output power is $P_o(t)=P_{oq}-kP_cG(\omega_c)$, where $$k = \frac{\eta_{cm} A}{G(\omega_o)}$$

from Equation 1. If the deviation of $\omega_c(t)$ from $\omega_{cq}$ (i.e., $\omega_c(t)-\omega_{cq}$) is small compared with the bandwidth of $G(\omega_c)$, then, by a Taylor expansion of G, the output power can be written as $$P_o - P_{oq} = \frac{\partial G(\omega)}{\partial \omega}\bigg|_{\omega_{cq}} [\omega_c(t) - \omega_{cq}]P_c, \qquad (3)$$

where $P_c$ is the optical power of control beam 207. Equation 3 shows explicitly how the instantaneous power of AM output beam 209 (i.e., $P_o-P_{oq}$) depends on the instantaneous deviation in frequency ($\omega_c-\omega_{cq}$), the differential gain $\partial G/\partial\omega$, and the power of the carrier for the input FM signal of control beam 207.

Of special note are the differential gain and its relation to the design of main laser 202. The characteristics of AM-modulated output beam 209 depend on the construction of the main laser and the type of laser heterostructure. Comparing the curves labeled QW1 and QW2 in FIG. 3 shows how the slope of the gain curve changes with the level of carrier injection. Therefore, by changing the gain required for lasing through $G(\omega_o)=\alpha/\Gamma$ (gain=loss) or other mechanisms, such as an intra-cavity saturable absorber, the peak modulation of the AM output beam 209 can be controlled. Equation 3 shows that the peak amplitude is directly related to the power of the optical carrier of control beam 207.

The same operating principles give rise to an optical wavelength converter. If, for example, main laser 202 operates at the peak gain $\omega_o$, then control beam 207 with any angular frequency $\omega_c$ that falls within the "quench" region of FIG. 3 can modulate output beam 209. For this application, according to FIG. 3, main laser 202 should be constructed of bulk material (homojunction laser), or it should have a relatively large loss so that the material has a large quenching bandwidth.

Standard semiconductor processing techniques can make the main laser, waveguides and mirrors in DAS-LOGiC devices. Control beam 207 can be injected into the side of main laser 202 in a number of ways that are standard in processing technology. For example:
(1) The material next to main laser 202 is etched away, and an optical fiber that carries the FM control beam is butt-coupled to the side of the cavity.
(2) The signal is applied to the side of the cavity through free-space (i.e., without the fiber acting as a conduit).
(3) A second laser or an optical amplifier is monolithically integrated with main laser 202. Control beam 207 can be injected through the end of the second laser or optical amplifier.
(4) Waveguides to carry control beam 207 are integrated on the same wafer.

The present invention is an opto-electronic device that demodulates FM, WM, and AM optical signals and converts them directly to amplified AM optical signals. Such a signal might be required for amplification, mixing, or signal routing. In addition, adjusting the gain so that the main laser lases can control, either electrically or optically, the apparatus of the present invention. An integrated absorption section in the laser cavity can be a photodetector that provides an electrical output in addition to the optical output.

The present invention works with a laser amplifier in place of main laser 202. The laser amplifier is a laser without mirrors. Usually an anti-reflective coating is added to its facets. Fiber lasers and a number of other types of lasers can be substituted for semiconductor main laser 202.

The type of heterostructure is important for the operating characteristics of the DAS LOGiC device used as a demodulator. Bulk material has the largest bandwidth (FWHM), while quantum boxes have the smallest bandwidth. Generally, the smaller bandwidth materials (for the reduced-dimensional structures) have the larger differential gain $\partial G/\partial\omega$, and they thus have the larger conversion efficiency.

Clearly many modifications and variations of the present invention are possible in light of the above teachings. It should therefore be understood that, within the scope of the inventive concept, the invention may be practiced otherwise than as specifically claimed.

What is claimed is:

1. Apparatus to manipulate the optical properties of light comprising:
    at least one fist source of stimulated optical emission emitting an output beam;
    at least one second source of optical emission emitting a control beam;
    structure permitting said control beam to interact with said output beam, whereby said output beam is modulated; and
    said apparatus performing at least one signal transformation chosen from the group consisting of FM demodulation, wavelength conversion, storage, signal amplification, regeneration, signal routing, transmission mode switching whether synchronous or asynchronous, packet switching, multiplexing, wavelength filtering, bistable switching, FM discrimination, and optical amplification.

2. Apparatus as in claim 1, wherein said output beam is modulated in both amplitude and frequency.

3. Apparatus as in claim 1, wherein said at least one second source emits light spontaneously.

4. Apparatus as in claim 1, wherein said at least one second source is an optical laser amplifier.

5. Apparatus as in claim 1, wherein said at least one second source is an optical fiber coupled to said first source.

6. Apparatus as in claim 1, wherein said at least one second source occupies a portion of said at least one first source.

7. Apparatus as in claim 1, wherein said at least one first source partially overlaps said at least one second source.

8. Apparatus as in claim 1, wherein said at least one first source has a separately-biased portion that forms a saturable absorber.

9. Apparatus as in claim 1, wherein said at least one first source has a separately-biased portion that forms a modulator.

10. Apparatus as in claim 1 wherein optical frequency modulation on said control beam is transformed into amplitude modulation on said output beam.

11. Apparatus as in claim 1 wherein wavelength modulation on said control beam is transformed into amplitude modulation on said output beam.

12. Apparatus as in claim 1 wherein said optical amplification is applied to signals present on said control beam.

13. A method of processing an optical signal comprising the steps of:
    obtaining a first source of stimulated optical emission;
    coupling to said first source a second source of optical emission;
    applying a bias to at least one of said first and second sources, said bias being a one of optical and electrical;
    extracting from said first source an optical signal modulated by said second source; and
    performing at least one signal transformation chosen from the group consisting of FM demodulation, wavelength conversion, storage, signal amplification, regeneration, signal routing, transmission mode switching whether synchronous or asynchronous, packet switching, multiplexing, wavelength filtering, bistable switching, FM discrimination, and optical amplification.

14. Apparatus to manipulate information encoded into an emission of light comprising:
    first means for generating a stimulated optical emission from at least one first source of stimulated optical emission;
    said at least one first source being susceptible to gain quenching;
    second means for generating an optical emission from at least one second source of optical emission; and
    said optical emission modulating said stimulated optical emission.

* * * * *